United States Patent [19]

Onda et al.

[11] 4,298,809

[45] Nov. 3, 1981

[54] GATE CIRCUIT FOR GATE TURN-OFF THYRISTOR

[75] Inventors: Kenichi Onda; Hisao Amano, both of Hitachi, Japan

[73] Assignee: Hitachi, Ltd., Tokyo, Japan

[21] Appl. No.: 78,470

[22] Filed: Sep. 24, 1979

[30] Foreign Application Priority Data

Sep. 26, 1978 [JP] Japan .................. 53-118970

[51] Int. Cl.³ ........................................ H03K 17/72
[52] U.S. Cl. .................................. 307/252 C
[58] Field of Search ............. 307/252 C, 252 M; 363/27, 54, 57

[56] References Cited

PUBLICATIONS

M. R. Martin et al., GTO Low Power Switching Circuit RCA Technical Notes No. 1174, Dec. 20, 1976.

Primary Examiner—John Zazworsky
Attorney, Agent, or Firm—Craig and Antonelli

[57] ABSTRACT

A gate circuit for use with a gate turn-off thyristor comprises a capacitor to be charged by a power source supplying a gate turn-on current. The capacitor is connected in series with a power source supplying a gate turn-off current.

3 Claims, 3 Drawing Figures

4,298,809

GATE CIRCUIT FOR GATE TURN-OFF THYRISTOR

BACKGROUND OF THE INVENTION

This invention relates generally to gate circuits for gate turn-off (GTO) thyristors and more particularly to a gate circuit for a GTO thyristor which uses two power sources for supplying currents to the gate electrode of the GTO thyristor and which can minimize power loss in the gate circuit.

The GTO thyristor is a switching element which is turned on, like thyristors of the other types, with gate current (gate turn-on current) entering into the gate electrode and turned off, unlike the other types, with reverse gate current (gate turn-off current) parting from the gate electrode.

The gate controlled turn-on time of the GTO thyristor depends on the magnitude of the gate turn-on current, and the greater the latter, the shorter the former becomes whereas the smaller the latter, the longer the former becomes. When examining a great number of GTO thyristors to make clear the relation between the gate controlled turn-on time and the magnitude of gate turn-on current, that is, turn-on characteristics, the turn-on characteristics prove to be irregular in respect of each of the GTO thyristors. The greater the magnitude of gate turn-on current, the smaller the irregularity in turn-on characteristics becomes whereas the smaller the former, the greater the latter becomes. Incidentally, it is thought in view of electrical equivalency that a GTO thyristor of large capacity consists of a great number of GTO thyristor elements of small capacity which are connected in parallel. In other words, the turn-on characteristics of the internal thyristor elements have tendency to be different from each other. If the irregularity in the turn-on characteristics is large between the internal thyristor elements, current will be concentrated to a certain internal thyristor element which will have been turned on rapidly and the GTO thyristor will face danger of being thermally broken down. Therefore, when turning on the GTO thyristor, it is necesary to supply a large amount of gate turn-on current in order to minimize the irregularity in the turn-on characteristics between the internal thyristor elements.

After the GTO thyristor has been turned on, there is the need of keeping continuous flow of a sufficient gate turn-on current for maintaining the the steady conduction state of the GTO thyristor during the desired conduction period, when taking into consideration such conditions as the GTO thyristor requires a larger holding current than ordinary thyristors and has its major application to a device which is loaded with a load of lagging power factor.

The gate turn-off time of the GTO tyhristor depends on the rising rate (di/dt) of the gate turn-off current, and the greater the latter (di/dt), the shorter the former becomes whereas the smaller the latter, the longer the former becomes. When examining a great number of GTO thyristors to make clear the relation between the gate turn-on time and the rising rate di/dt (namely, the turn-off characteristics), the turn-off characteristics, like the turn-on characteristics, prove to be irregular in respect of each of the GTO thyristors. The greater the rising rate di/dt, the smaller the irregularity in turn-off characteristics becomes whereas the smaller the former, the greater the latter becomes. If the irregularity in the turn-off characteristics is large between the internal GTO thyristor elements, current will be concentrated to a certain internal thyristor element which will have been turned off late and the GTO thyristor will face danger of being thermally broken down. Therefore, when turning off the GTO thyristor, it is necessary to supply a gate turn-off current of high rising rate in order to minimize the irregularity in the turn-off characteristics.

It will be understood from the above description what waveform the gate current suitable for driving the GTO thyristor must have. It will thus be appreciated that there is an urgent demand for advent of a gate circuit which is suitable for producing the gate current of the desired waveform.

SUMMARY OF THE INVENTION

An object of this invention is to provide a gate circuit for GTO thyristors which can be minimized in power loss.

Another object of this invention is to provide a gate circuit for GTO thyristors which can be compact and inexpensive.

Still another object of this invention is to suppress the peak value of current passed through a switching element included in the gate circuit.

To attain the above objects, according to this invention, a capacitor is provided which is charged by a power source supplying a gate turn-on current, and the capacitor is connected in series with a power source supplying a gate turn-off current (gate turn-off power source). The reason why this arrangement can attain the objects set forth above will become clear when reading a detailed description of the invention to be given hereinafter.

DESCRIPTION OF PRIOR ART GATE CIRCUIT

Figure 1:
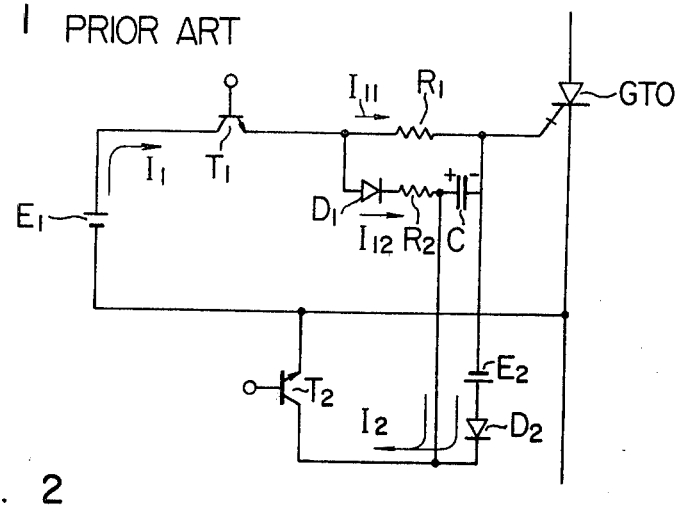
FIG. 1 is a circuit diagram of a prior art gate circuit for GTO thyristors.
Figure 2:
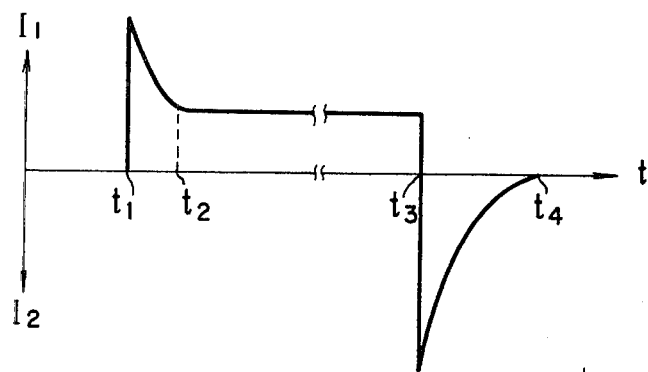
FIG. 2 is a waveform chart of a gate current to be passed through the gate circuit of FIG. 1.

FIG. 1 shows an illustrative, prior art gate circuit for use with a GTO thyristor. The gate circuit comprises a capacitor connected as shown for producing the gate current waveform as illustrated in FIG. 2.

In FIG. 1, a gate turn-on power source $E_1$ is connected between the gate and cathode electrodes of a GTO thyristor with its positive pole connected to the gate electrode via a transistor $T_1$ and a resistor $R_1$ and its negative pole connected directly to the cathode electrode. A gate turn-off power source $E_2$ is also connected between the gate and cathode electrodes of the GTO thyristor with its positive pole connected to the cathode electrode via a diode $D_2$ and a transistor $T_2$ and its negative pole connected directly to the gate electrode. A series connection of a diode $D_1$, a resistor $R_2$ and a capacitor C is connected in parallel with the resistor $R_1$. A junction between the resistor $R_2$ and the capacitor C is connected directly to a junction between the diode $D_2$ and the transistor $T_2$.

It is to be noted that voltage $e_1$ of the power source $E_1$ is selected to be higher than voltage $e_2$ of the power source $E_2$ to ensure that the rising rate di/dt is maximized upon conduction of the gate turn-off current by making the charging voltage of the capacitor C higher than voltage $e_2$, since the capacitor C is connected in parallel with the gate turn-off power source $E_2$. If the charging voltage of the capacitor C is lower than $e_2$, di/dt solely depends on $e_2$ which cannot be above the gate-cathode reverse breakdown voltage of the GTO thyristor and the rising rate di/dt is therefore restricted to a value determined by the reverse breakdown voltage. Where wirings of the gate circuit have an inductance L, the rising rate di/dt is expressed as, $$di/dt = e_2/L \qquad (1)$$

Then, for $e_2 = 15$ V which is selected in consideration of the fact that the reverse breakdown voltage ranges from 18 to 20 V, the upper limit of di/dt is 20 to 30 A/µs at the most even when inductance L is designed to be minimized. The rising rate di/dt is impossible to exceed the upper limit. Therefore, $e_1 > e_2$ is necessarily determined.

The gate circuit shown in FIG. 1 operates as follows. The GTO thyristor is initially non-conductive. When the transistor $T_1$ is first turned on at time $t_1$ as shown in FIG. 2, gate turn-on current $I_1$ is passed through a first path of $E_1$-$T_1$-$R_1$-GTO-$E_1$ and second path of $E_1$-$T_1$-$D_1$-$R_2$-C-GTO-$E_1$, thereby turning on the GTO thyristor. Upon completion of charging the capacitor C with the voltage of polarity as shown in FIG. 1, the gate turn-on current $I_1$ ceases to flow through the second path. This time corresponds to time $t_2$ as shown in FIG. 2. Thereafter, the gate turn-on current $I_1$ flows only through the first path during a conduction period of the GTO thyristor (time interval ranging from $t_2$ to $t_3$ in FIG. 2). When the transistor $T_1$ is then turned off and the transistor $T_2$ is turned on at time $t_3$ as shown in FIG. 2, gate turn-off current $I_2$ begins to flow through a path of C-$T_2$-GTO-C to discharge the capacitor C since the charging voltage of the capacitor C is higher than $e_2$ as described above. As the voltage of the capacitor C falls below $e_2$, the gate turn-off current turns to flow through a path of $E_2$-$D_2$-$T_2$-GTO-$E_2$ to thereby complete turning-off of the GTO thyristor at time $t_4$ as shown in FIG. 2.

In accordance with this prior art gate circuit, the rising rate di/dt can be increased by increasing $e_1$, in other words, by making the charging voltage of the capacitor C higher than $e_2$. For $e_1 = 24$ V, for example, the rising rate di/dt can be extended up to 40 to 50 A/µs. This prior art gate circuit, however, has the following disadvantages. In the first place, the increased $e_1$ results in an increased power loss in the resistor $R_1$ and consequent poor efficiency. In the second place, the resistor $R_1$ thus forced to have a large wattage enlarges the overall size of the gate circuit and makes the gate circuit expensive. The third disadvantage is due to the fact that the increased initial charging current to the capacitor C tends to cause an overcurrent to pass through the transistor $T_1$ and the gate electrode of the GTO thyristor. More particularly, the initial voltage across the capacitor C is zero and the charging voltage of the capacitor C is not allowed to fall below $e_2$ during the stationary operation, so that peak value $i_{c1}$ of the initial charging current and peak value $i_{c2}$ of the charging current during the stationary operation are respectively expressed by the following equations:

$$i_{c1} = e_1/r_2 \qquad (2)$$

$$i_{c2} = (e_1 - e_2)/r_2 \qquad (3)$$

where $r_2$ represents the resistance of the resistor $R_2$. In order to supply to the GTO thyristor a sufficient initial gate turn-on current for the stationary operation, it is necessary to determine the resistance $r_2$ in such a manner that $i_{c2}$, rather than $i_{c1}$, has a sufficient magnitude. Since the resistance $r_2$ is so determined as to comply with the above manner, $i_{c1}$ is sympathetically increased in accordance with the equation (2) and hence the transistor $T_1$ and the gate electrode of the GTO thyristor face danger of being supplied with an overcurrent.

DETAILED DESCRIPTION OF PREFERRED EMBODIMENTS

Figure 3:
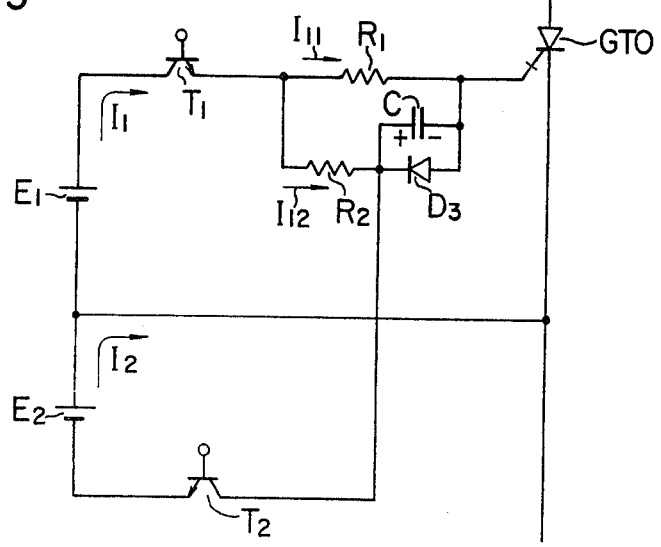
FIG. 3 is a circuit diagram of a gate circuit for GTO thyristors embodying this invention wherein the gate current as shown in FIG. 2 is also passed.

FIG. 3 shows a preferred embodiment of this invention which can eliminate the disadvantages of the prior art gate circuit of FIG. 1. As diagrammatically shown in FIG. 3, a gate turn-on power source $E_1$ is connected between the gate and cathode electrodes of a GTO thyristor with its positive pole connected to the gate electrode via a transistor $T_1$ and a resistor $R_1$ and its negative pole connected directly to the cathode electrode. A gate turn-off power source $E_2$ is also connected between the gate and cathode electrodes of the GTO thyristor with its positive pole, like the negative pole of the power source $E_1$, connected directly to the cathode electrode and its negative pole connected to the gate electrode via a transistor $T_2$ and a parallel connection of a capacitor C and a diode $D_3$. A junction between the transistor $T_2$ and the parallel connection is connected to a junction between the transistor $T_1$ and the resistor $R_1$ via a resistor $R_2$. In modifications, the transistor $T_1$ may be connected to the negative pole of the power source $E_1$ and the transistor $T_2$ may be connected to the positive pole of the power source $E_2$; and a discharge prevention diode such as diode $D_1$ of FIG. 1 may be connected in series with the resistor $R_2$.

The gate circuit of FIG. 3 operates as follows. The GTO thyristor is initially non-conductive. When the transistor $T_1$ is turned on at time $t_1$ as shown in FIG. 2, the gate turn-on current $I_1$ begins to flow through a first path of $E_1$-$T_1$-$R_1$-GTO-$E_1$ and a second path of $E_1$-$T_1$-$R_2$-C-GTO-$E_1$, thereby turning on the GTO thyristor. Upon completion of charging the capacitor C with the voltage of polarity as shown in FIG. 3, the gate turn-on current $I_1$ ceases to flow through the second path at time $t_2$ as shown in FIG. 2 Thereafter, the gate turn-on current $I_1$ flows only through the first path during a conduction period of the GTO thyristor, i.e., time interval from $t_2$ to $t_3$. When the transistor $T_1$ is there turned off and the transistor $T_2$ is turned-on at time $t_3$ as shown in FIG. 2, gate turn-off current $I_2$ begins to flow through a path of $E_2$-GTO-C-$T_2$-$E_2$. Since the gate turn-off power source $E_2$ is connected in series with the capacitor C, the gate turn-off current $I_2$ flows at an initial value which depends on a sum of the charging voltage of the capacitor C and $e_2$ to ensure that the rising rate di/dt of $I_2$ can be maximized. After completion of discharging the capacitor C, the gate turn-off current $I_2$ is allowed to flow through a path of $E_2$-GTO-$D_3$-$T_2$-$E_2$ until the GTO thyristor is turned off at time $t_4$ as shown in FIG. 2.

Eminent effects of the gate circuit according to this invention will be described in detail in comparison with the prior art gate circuit.

The power loss in the gate circuit will first be discussed. Conditional values are set herein for the discussion wherein the peak value of the gate turn-on current $I_1$ is 10 A, current $I_{11}$ necessary for keeping the steady conduction of the GTO thyristor (passed through the resistor $R_1$) is 3 A and accordingly the peak value of charging current $I_{12}$ of the capacitor C (passed through the resistor $R_2$) is 7 A, and the on-duty of the GTO thyristor is 50%. It is also assumed that voltage drops across the transistors and the diode are negligible. With the prior art gate circuit of FIG. 1 wherein $e_1$ is 24 V for the sake of extending the di/dt up to 40 to 50 A/μs and $e_2$ is 15 V on account restriction of the gate-cathode reverse breakdown voltage of the GTO thyristor, resistance $r_1$ of the resistor $R_1$ is, $$r_1 = e_1/I_{11} = 24/3 = 8 \ (\Omega),$$

and then average power loss W in the resistor $R_1$ is, $$W = \tfrac{1}{2} \cdot (I_{11})^2 \cdot r_1 = 36 \ (W).$$

Contrary to this, with the gate circuit according to the embodiment of FIG. 3 wherein voltage $e_1'$ of the gate turn-on power source $E_1$ can be reduced to $24-15=9$ (V) since it is sufficient that the sum of voltage $e_1'$ of $E_1$ and voltage $e_2$ of $E_2$ being 15 V as in the prior art gate circuit corresponds to $e_1$ of 24 V in FIG. 1 prior art gate circuit which is necessary to obtain the increased di/dt, resistance $r_1'$ of the resistor $R_1$ is, $$r_1' = e_1'/I_{11} = 9/3 = 3 \ (\Omega),$$

and then average power loss W' in the resistor $R_1$ is, $$W' = \tfrac{1}{2} \cdot (I_{11})^2 \cdot r_1' = 13.5 \ (W).$$

When comparing power loss W with power loss W', $(W'/W) \times 100 = 37.5$ (%) results. Thus, the power loss in the resistor $R_1$ according to the invention is 37.5% of that according to the prior art.

Secondly, from the standpoint of size and cost of the gate circuit, the gate circuit of the preferred embodiment is advantageous in that the resistor $R_1$ is allowed to have a small wattage because of the minimized power loss therein and hence it can be of a small volume and inexpensive, thereby ensuring that the gate circuit as a whole can be compact and inexpensive.

Thirdly, to discuss the overcurrent passed through the prior art gate circuit of FIG. 1, the equation (3) is reduced to, $$r_2 = (e_1 - e_2)/i_{c2} = 1.29 \ (\Omega).$$

By combining this value of $r_2$ with the equation (2), $$i_{c1} = e_1/r_2 = 18.60 \ (A)$$

is obtained. This value of $i_{c1}$ is added with the current $I_{11}$ of 3 A passing through the resistor $R_1$ and the initail value of the gate turn-on current $I_1$ is expressed as, $$i_{c1} + I_{11} = 21.60 \ (A).$$

In contrast, according to the gate circuit of FIG. 3 embodiment, the charging current of the capacitor C is constantly 7 A irrespective of the initial charging and the charging during the stationary operation because the voltage of the capacitor C becomes zero after the flow of the gate turn-off current $I_2$ has taken place. Consequently, the gate turn-on current having a peak value of more than 10 A will not be passed through the transistor $T_1$. In other words, in the embodiment of the invention and unlike the prior art, the transistor $T_1$ with a current capacity of 10 A is sufficient to prevent it from being broken down by the overcurrent.

What is claimed is:
1. A gate circuit for a GTO thyristor comprising:
a first series connection of a first DC power source and a first switching element connected between the gate and cathode electrodes of said GTO thyristor for supplying a gate turn-on current to said GTO thyristor;
a capacitor being charged by said first series connection; and
a second series connection of a second DC power source and a second switching element connected in series with said capacitor between the gate and cathode electrodes of said GTO thyristor for supplying a gate turn-off current to said GTO thyristor.
2. A gate circuit for a GTO thryistor comprising:
a first series connection of a first DC power source and a first switching element connected in series with a first resistor between the gate and cathode electrodes of said GTO thyristor for supplying a gate turn-on current to said GTO thyristor;
a second series connection of a second resistor and a capacitor connected in parallel with said first resistor;
a diode connected in parallel with said capacitor; and
a third series connection of a second DC power source and a second switching element connected in series with said capacitor between the gate and cathode electrodes of said GTO thyristor for supplying a gate turn-off current to said GTO thyristor.
3. A gate circuit according to claim 1 or 2, wherein each of said first and second switching elements is a transistor.

* * * * *